United States Patent [19]

Corluy et al.

[11] 4,118,228

[45] Oct. 3, 1978

[54] PHOTOGRAPHIC MATERIALS SUITED FOR THE PRODUCTION OF COLOR SEPARATIONS

[75] Inventors: Hans Josephus Corluy, Berchem, Belgium; Franz Moll, Leverkusen-Steinbuchel, Fed. Rep. of Germany; Herbert Müller, Marie Hase, Schildgen-Berg. Gladbach, Fed. Rep. of

[73] Assignee: Agfa-Gevaert N.V., Mortsel, Belgium

[21] Appl. No.: 707,882

[22] Filed: Jul. 22, 1976

[30] Foreign Application Priority Data

Jul. 26, 1975 [DE] Fed. Rep. of Germany ....... 2533602

[51] Int. Cl.$^2$ ............................ G03C 7/16; G03C 1/76
[52] U.S. Cl. ................................................. 96/17; 96/69
[58] Field of Search ........................................ 96/17, 69

[56] References Cited

U.S. PATENT DOCUMENTS

| | | | |
|---|---|---|---|
| 2,704,254 | 3/1955 | Gresham | 96/69 |
| 3,130,053 | 4/1964 | Hellmig et al. | 96/69 |
| 3,396,024 | 8/1968 | Hellmig et al. | 96/69 |

FOREIGN PATENT DOCUMENTS 645,288  10/1950  United Kingdom ..................... 96/137

*Primary Examiner*—Won H. Louie, Jr.
*Attorney, Agent, or Firm*—William J. Daniel

[57] ABSTRACT

Figure 1:
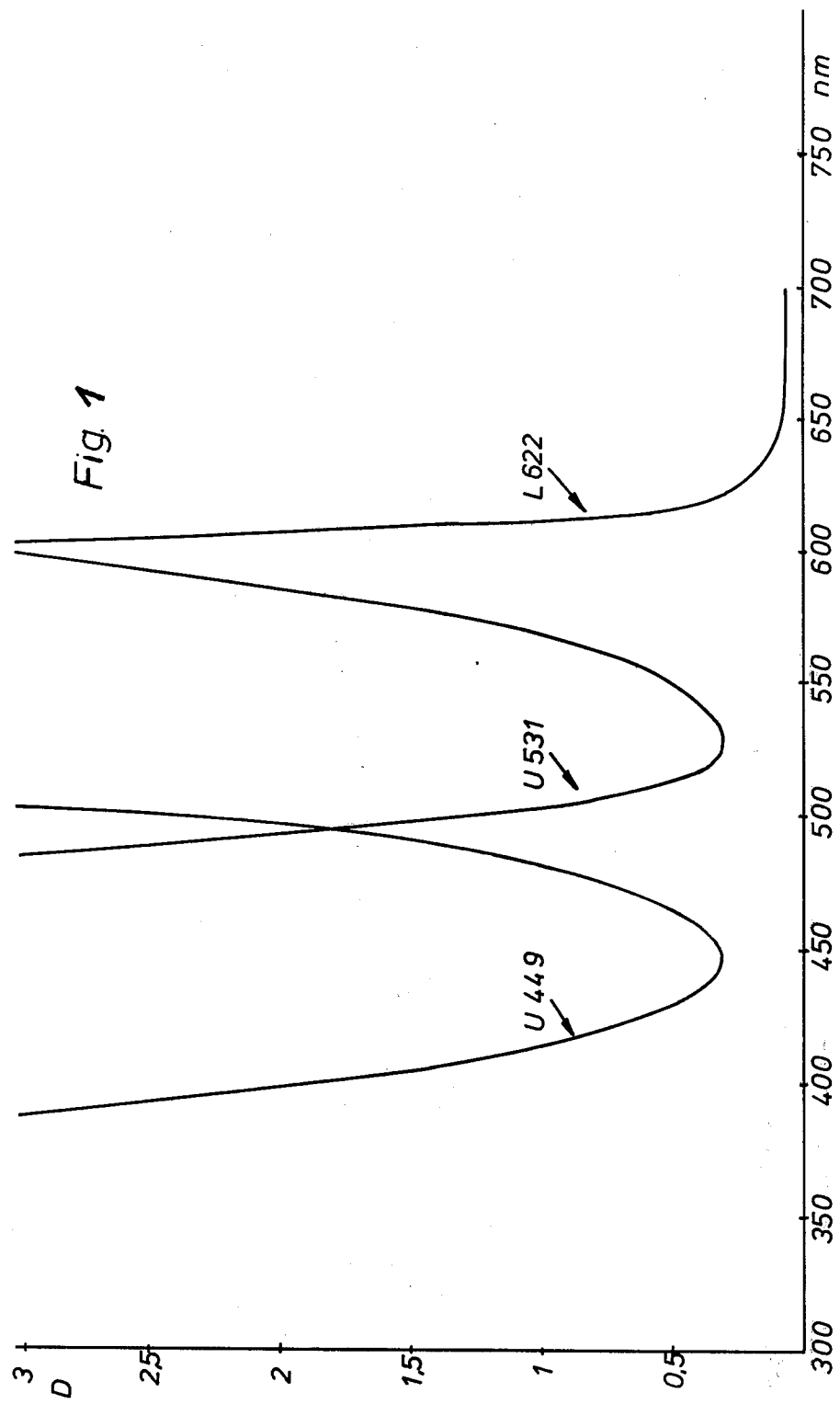

Photographic panchromatic black-and-white silver halide recording material having two silver halide emulsion layers wherein a layer, called hereinafter first layer, has a panchromatic sensitivity and another layer, called hereinafter second layer, has a blue sensitivity, which is, when determined on comparable wedge images, at density 0.3 at least 0.6 log I.t units higher than its separately considered green and red sensitivity, wherein for the determination of the sensitivities a blue filter, a green filter, and a red filter as characterized in FIG. 1 are used, both said layers having a substantially identical threshold sensitivity to blue light and the spectral sensitivity of this material at 650 nm being at least 0.8 powers of ten lower than at 620 nm, the sensitivity beyond 650 nm diminishing even further.

14 Claims, 5 Drawing Figures

PHOTOGRAPHIC MATERIALS SUITED FOR THE PRODUCTION OF COLOR SEPARATIONS

The present invention relates to a photographic material that is suited for the production of colour separation images for photomechanical colour reproduction.

In the preparation of a printing plate for colour reproduction purposes, one generally starts from a photographic multicolour original e.g. a diapositive. The multicolour original is photographed three times consecutively, each time on a separate panchromatic silver halide film or plate of the negative type. A first record is made through a red filter, a second through a green filter, and a third through a blue filter. Consequently, three colour separation images are obtained. These separation images are called separation negatives or separation positives depending on whether a positive or a negative is used.

Starting from the colour separation images three separate printing plates are produced (optionally via intermediate positives and/or negatives).

The printing plate made from a red filter negative is used for the printing with cyan ink, whereas the printing plate obtained by means of the green filter negative is used for the printing of the magenta ink and the printing plate obtained through the blue filter negative is used for the printing of the yellow ink. When these three printing plates with said three printing inks are used for printing in register on a piece of white paper, a colour reproduction of the original is obtained. Optionally a grey separation image can be produced also for the manufacture of a fourth printing plate for the printing with black ink. The black printing gives more contrast to the colour image.

Image areas consisting of yellow and magenta ink printed one upon another absorb blue and green light and reflect red light. Image areas consisting of yellow and cyan ink printed one upon another absorb blue and red light and reflect green light. Image areas consisting of magenta and cyan ink printed one upon another absorb green and red light and reflect blue light.

By the use of the above-mentioned printing plates with the corresponding inks six different pure colours viz. cyan, magenta, yellow, red, green, and blue can be reproduced. White is reproduced by the image background e.g. paper that has not been covered with printing ink.

In practice, the dyes, out of which a photographic multicolour original is composed, show a more or less weak side-absorption. Indeed, the magenta dye of the original has a side-absorption in the red spectral range which is more than negligible. In order to have more contrast between the white image areas and the red image areas of the reproduction as well as an improved contrast rendering in the red image areas this side-absorption can be utilized to print cyan additionally in the red image areas.

The improvement of the detail rendering with the cyan printer does not only depend on the side-absorption in the red spectral range of the magenta dye of the colour original but also on the spectral characteristics of the red light used in the production of the colour separation image and on the spectral sensitivity of the panchromatic material used therefor.

The red light used for making the red separation image is obtained in general by the use of a cut-off filter, which transmits almost no light underneath a wavelength of 590 nm.

It is an object of the present invention to provide a panchromatic black-and-white silver halide material, which in the production of a red filter separation image yields an improved contrast rendering in the red image areas and which is capable of providing images with essentially identical gradation values when exposed with blue, green, and red light.

In accordance with the present invention, a photographic black-and-white silver halide recording material containing two silver halide emulsion layers is provided, which silver halide material contains a layer, called first layer hereinafter and having a panchromatic sensitivity and another layer, called second layer hereinafter, having a blue sensitivity, which, when determined on comparable wedge images, is at density 0.3 at least 0.6 log I.t units higher than its green and red sensitivity considered separately, wherein for the determination of these sensitivities the filters U449 (blue filter), U531 (green filter), and L622 (red filter) (see FIG. 1) are used, both said layers having an essentially identical threshold sensitivity to blue light, and the spectral sensitivity of the overall material at 650 nm being at least 0.8 powers of ten lower than at 620 nm, the sensitivity decreases further beyond 650 nm.

The term "Relative Sensitivity Test" used herein employs for the exposures of the second layer to blue, green and red light, filters having the characteristics identified in FIG. 1 of the accompanying drawings and designated U449, U531 and L622 respectively. The exposures are exposures through comparable optical wedges and the different sensitivities compared are those at density 0.3.

According to a preferred embodiment of the invention the spectral sensitivity of the said material at 650 nm is 1.10 to 1.30 powers of ten lower than at 620 nm.

For the production of a red filter separation image this material is preferably exposed through a red filter having a transmittance of less than 50% at 595 nm.

Figure 2:
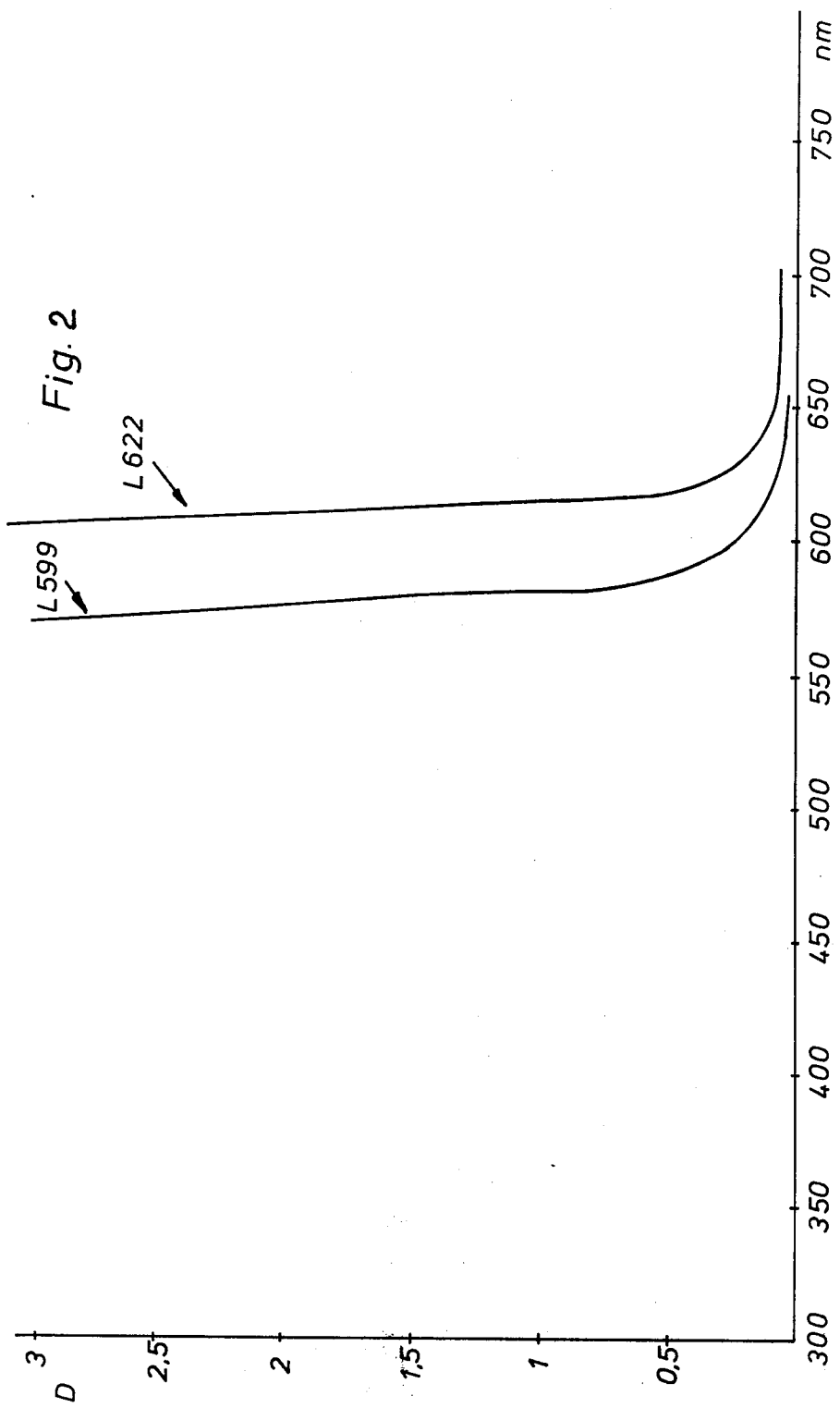
Figure 3:
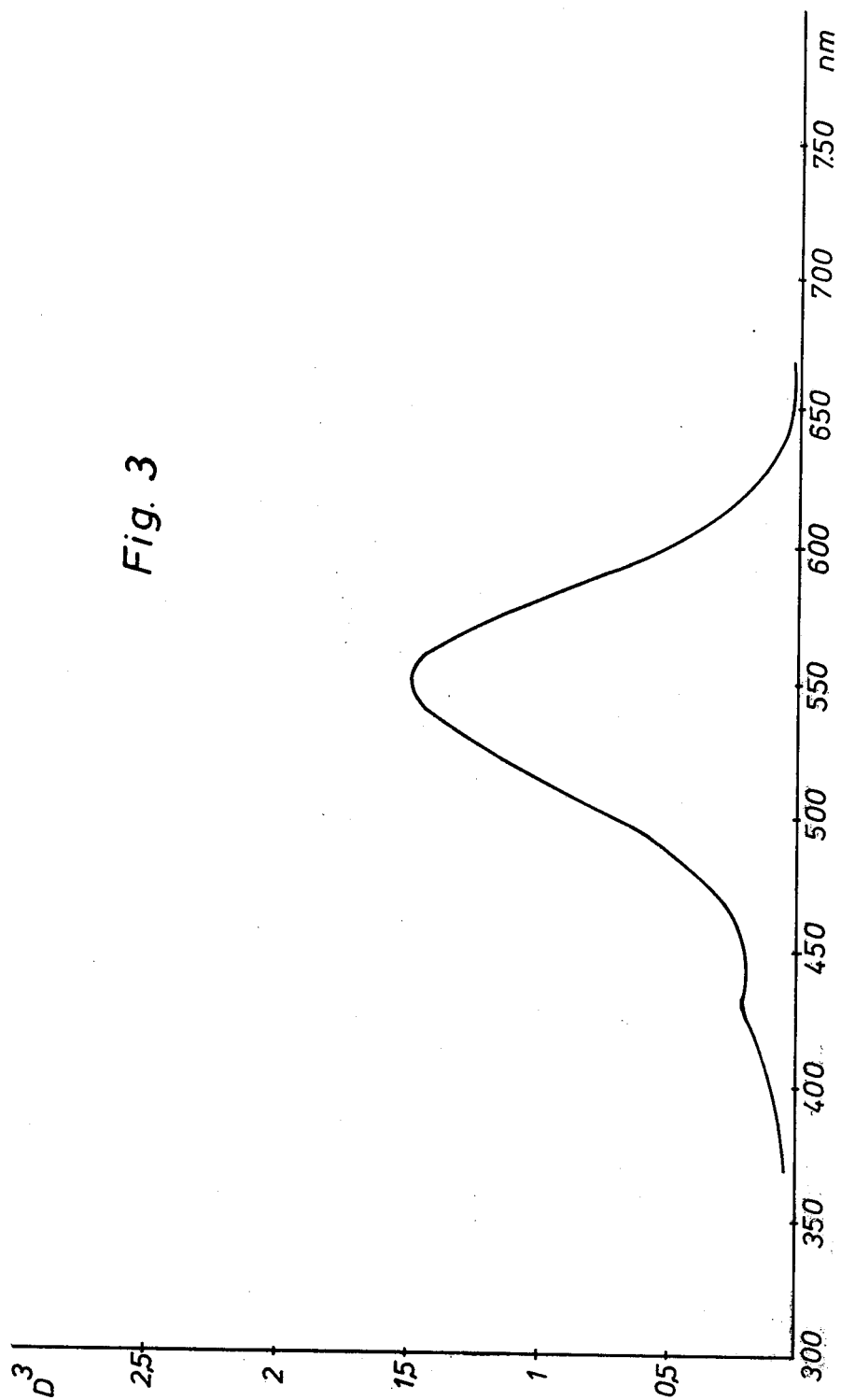

Density (D) versus wavelength (nm) curves of preferred red filters are represented in FIG. 2 with the notations L599 and L622. As an original for the production of colour separation images in general a photographic colour diapositive is used, which contains a magenta dye with side-absorption in the red spectral range (beyond 600 nm). The absorption curve of the magenta dye of a common colour original is represented in FIG. 3.

The first layer in the material according to the invention is a panchromatic layer allowing the production of blue filter, green filter and red filter separation images respectively.

The second layer is a so-called correction layer serving to correct too flat a gradation of the panchromatic layer when exposed to blue light. The presence of such a correction layer is especially advantageous since it is known e.g. from the German Patent Specification No. 1,447,568 filed Apr. 20, 1963 by Agfa AG that usually the gradation of sensitized layers is steeper in the spectral range, to which they have been sensitized e.g. in the green or red spectral range, than in the range of the inherent sensitivity of the silver halide i.e. the light from the blue spectral range. Considerable disadvantages are attached to this in practice, especially in the production of colour separation images. In the reproduction of multicoloured originals the gradation of the blue filter separation image made with blue light is considerably flatter than the gradation of the green filter and red filter separation images made with green and red light respectively. Since all three colour separation images should have the same gradation for reprotechnical reasons, one is forced to develop the separations in a different way. So, the green and red filter separation images are processed for a shorter time or the blue filter separation image is processed for a prolonged time. Such is very embarrassing in practice. It is particularly disadvantageous for automatic processing which is being introduced ever more. Indeed, in automatic processing only a same processing treatment of all colour separation images is desired.

The silver halide coverage of the second layer depends on the difference in gradation of the upper layer image in respect of blue light and both other gradations (green and red light image). A minor gradation difference can be corrected already by a blue-sensitive layer with a relatively low silver halide coverage. For correction of a considerable gradation difference a blue-sensitive layer with a relatively high silver halide coverage is needed. The optimal coverage can be determined experimentally without any difficulties by making a few tests.

Both light-sensitive layers can be applied to the same side as well as to opposite sides of the support. In the latter case the support should be transparent, of course.

It is preferable anyway to apply the layers in such a way that the panchromatic layer faces the light source, whereas the correction layer (the mainly blue-sensitive layer) is turned away from the light source. Yet, the opposite layer sequence is possible too. If the layers of the above-mentioned panchromatic colour separation film are applied to one side of the support, the panchromatically sensitized layer is preferably the upper layer, the mainly blue-sensitive layer (correction layer) being a subjacent layer that is closest to the support.

According to the present invention the first layer i.e. the panchromatic layer contains a spectral sensitizing dye or a mixture of such dyes giving the photographic material a spectral sensitivity, which at 650 nm is at least 0.8 powers of ten as low as at 620 nm, the sensitivity diminishing further beyond 650 nm.

According to a preferred embodiment the same silver halide composition is used for the second layer i.e. the correction emulsion layer as well as for the panchromatic emulsion layer. Furthermore, it is also possible to start from two different emulsions in so far as they possess substantially the same blue threshold sensitivity e.g. by controlling the ripening. An essentially identical blue threshold sensitivity means that, when measured on comparable wedge images at a density of 0.3 a difference in sensitivity of at most 0.2 log I.t is found.

By the addition of one or more sensitizing dyes to the said second layer the gradation of the corresponding colour separation images can be influenced additionally. For instance, the rectilinearity can be improved.

Sensitizing dyes, which when used alone, can effect the desired spectral sensitivity of the material according to the invention correspond to the following general formula I:

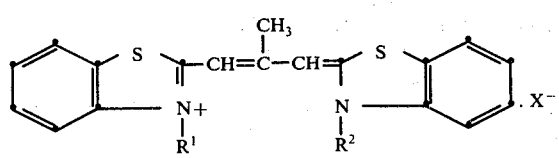

in which represent:
R¹, R² (similar or different) a lower alkyl group (preferably ethyl), sulphoalkyl (preferably sulphopropyl, sulphobutyl, sulphoisobutyl), carboxyalkyl (preferably carboxyethyl),
X⁻ an anion that does not exist, when R¹ or R² represents sulphoalkyl.
Examples of such dyes can be found in table 1.

Table 1

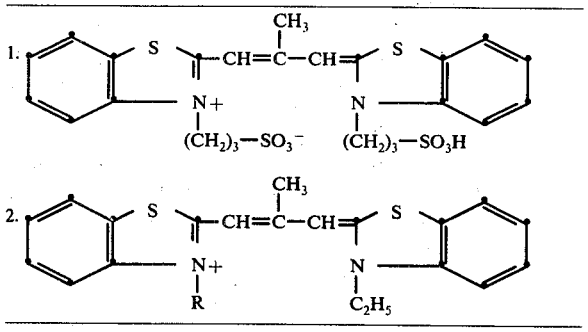

in which R represents

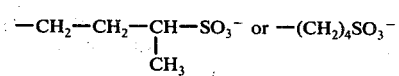

and mixtures of such sensitizing dyes with different R substituents.

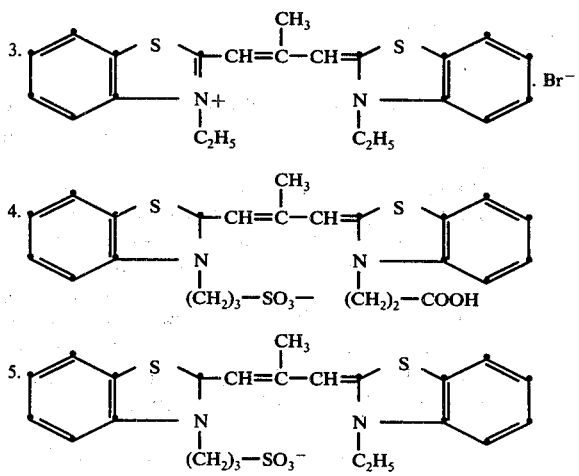

Sensitizing dyes, which can be used successfully in the manufacture of the material according to the invention in combination with the above-mentioned sensitizing dyes of the general formula I correspond to the following general formula

II:

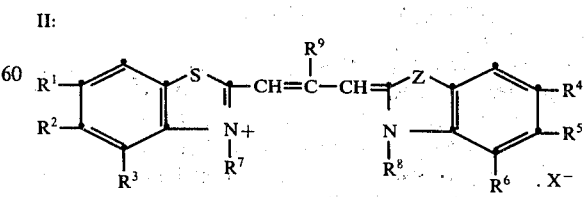

in which represent:
Y O, NR (wherein R is lower alkyl, preferably methyl or ethyl), Z   S, Se, R¹, R², R³   hydrogen, methyl, aryl, halogen, alkylmercapto (preferably methylmercapto) or R¹ and R² or R² and R³ together represent the ring elements needed to complete an aromatic nucleus, R⁴, R⁵, R⁶:  hydrogen, methyl, methoxy, halogen or R⁵ and R⁶ together represent the ring elements needed to complete an aromatic ring, R⁷, R⁸   (similar or different) lower alkyl (preferably methyl or ethyl), sulphoalkyl (preferably sulphopropyl, sulphobutyl, sulphoisobutyl, lower carboxyalkyl (preferably carboxyethyl), acylaminosulphonylalkyl, N-alkylsulphonylcarbonamidoalkyl, R⁹   hydrogen, lower alkyl (preferably ethyl), and X   an anion that does not exist, when R⁷ or R⁸ has an anionic structure.

Examples of dyes corresponding to formula II can be found in Table 2.

Table 2

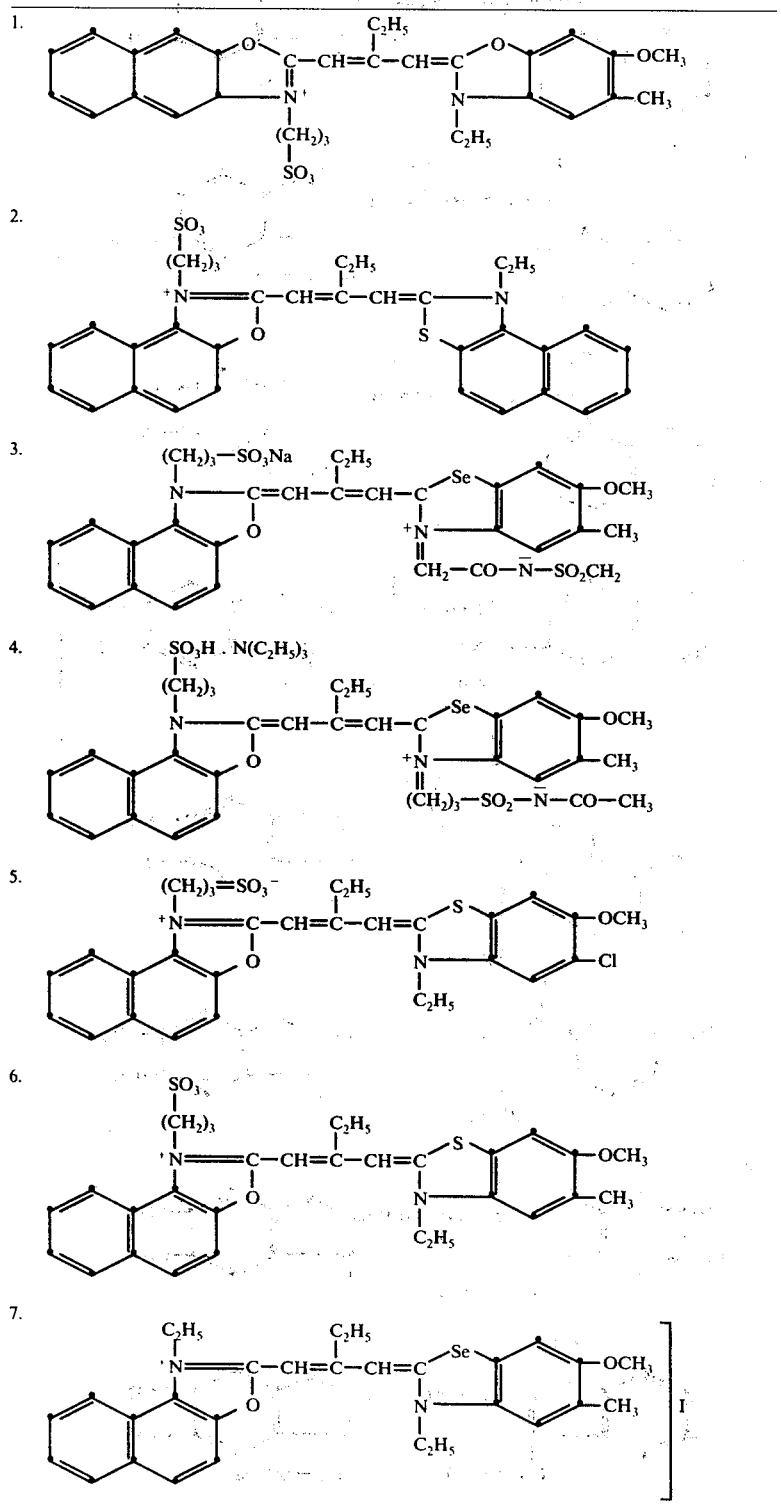

Table 2-continued
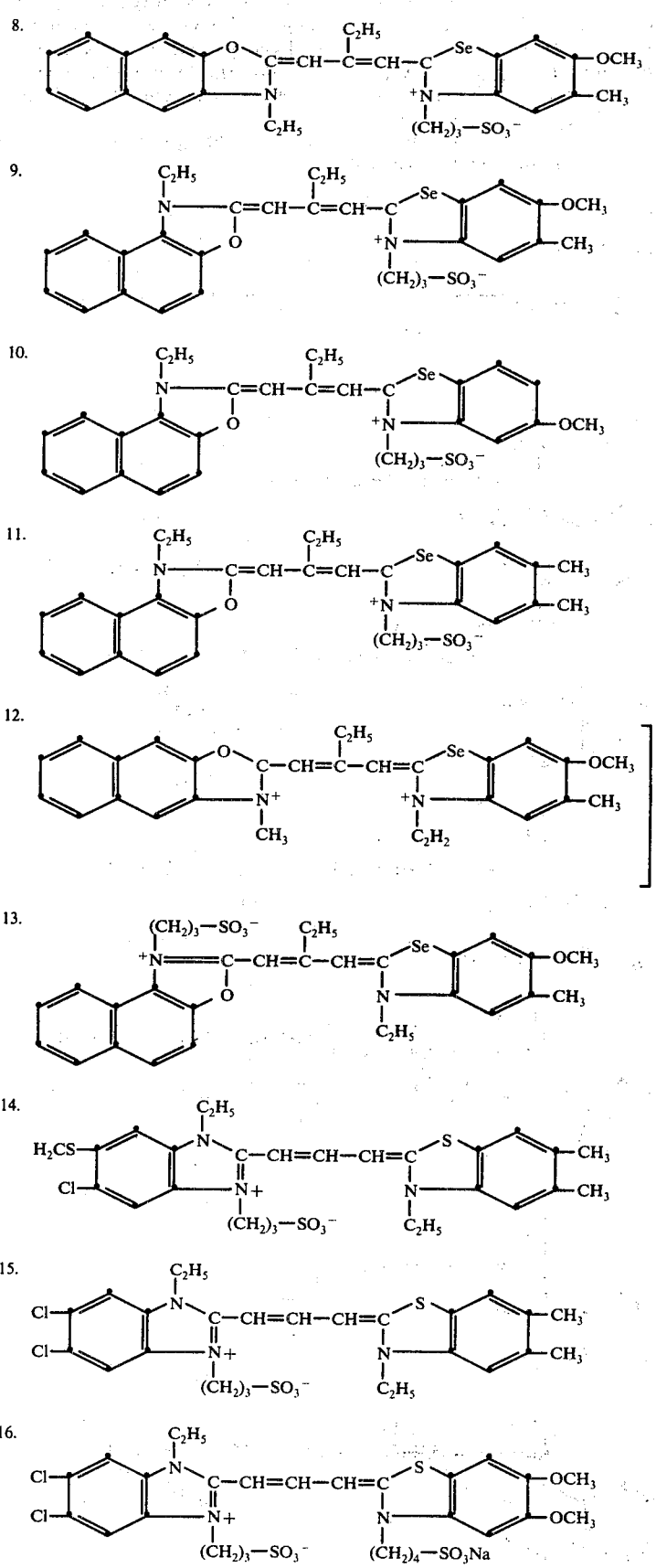

Table 2-continued

17. 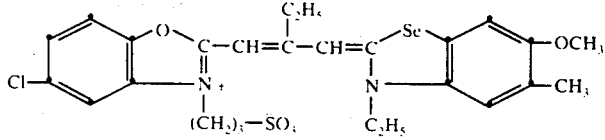

18. 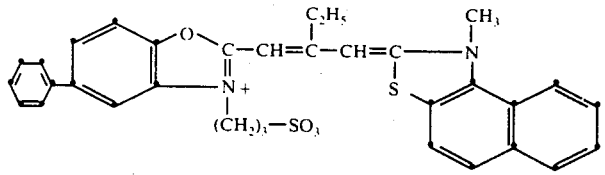

19. 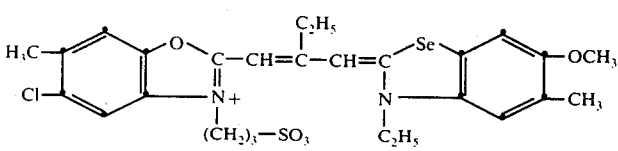

20. 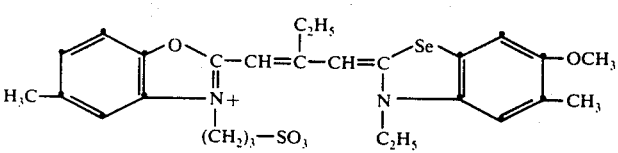

Sensitizing dyes that cannot be used alone for sensitizing purposes according to the present invention, but which can be used in combination with the above-mentioned sensitizing dyes according to general formula II correspond to the following general formula III:

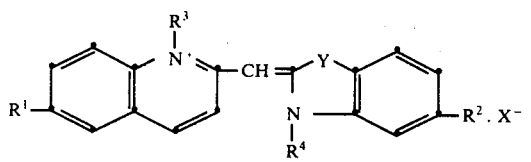

in which:

$R^1$, $R^2$ (similar or different) represent hydrogen, methyl, methoxy, halogen, Y represents Se, CH=CH, $R^3$, $R^4$ (similar or different) represent methyl, ethyl, sulphoalkyl, e.g. sulphopropyl, sulphobutyl, sulphoisobutyl, $X^-$ represents an anion that does not exist when $R^3$ or $R^4$ represents sulphoalkyl.

Examples of dyes corresponding to the general formula III can be found in Table 3.

Table 3

1. 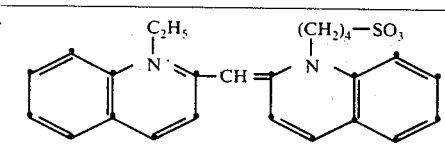

2. 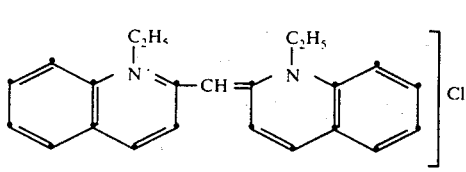

Table 3-continued

3. 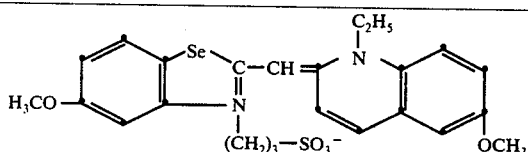

4. 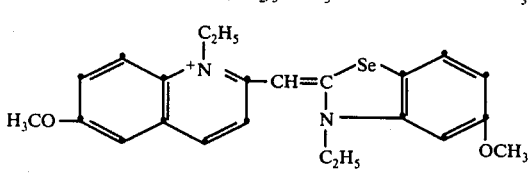

The above-mentioned sensitizing dyes can be prepared according to methods known to those skilled in the art.

The amount of spectral sensitizing dye per mole of silver halide depends on the desired sensitivity. Suitable amounts vary between 50 mg and 300 mg per mole of silver halide.

According to a preferred embodiment the silver halide of the first emulsion layer is sensitized panchromatically with a mixture of sensitizing dye 2 from Table 1 and sensitizing dye 13 from Table 2. A minor amount e.g. less than 20 mg per mole of silver halide of a sensitizing dye corresponding to formule II can be incorporated into the emulsion of the second silver halide emulsion layer (correction layer).

Suitable light-sensitive salts are such silver salts as silver chloride, silver bromide, silver iodide, and mixtures of these halides. Preferred light-sensitive salts are silver bromide iodide emulsions having an iodide content of at most 8 mole %, emulsions having a higher content of iodide being usable as well.

The preparation of the emulsions can be performed according to known processes described in literature e.g. by P. GLAFKIDES in Photographic Chemistry, Volume I (1958) or by MEES/JAMES in "The Theory of the Photographic Process" (1966), page 36.

Suitable hydrophilic colloids that can be used as binding agents for light-sensitive photographic silver halide emulsions, are the common hydrophilic colloids e.g. gelatin, albumin, zein, casein, alginic acid, collodion, cellulose derivatives such as carboxymethylcellulose, synthetical hydrophilic colloids such as polyvinyl alcohol and poly-N-vinylpyrrolidone, etc. If needed, compatible mixtures of two or more colloids can be used likewise for dispersing the silver halide.

The emulsions can be sensitized chemically by ripening in the presence of small amounts of sulphur-containing compounds such as e.g. allylthiocyanate, allylthiourea, sodium thiosulphate, etc. The emulsions can be sensitized also by means of reducing agents such as e.g. tin compounds as described in the French Patent Specification No. 1,146,955 filed Apr. 11, 1956 by Gevaert Photo-Producten N.V. and in the Belgian Patent Specification No. 568,687 filed June 18, 1958 by Gevaert Photo-Producten N.V., iminoaminomethanesulphinic acid compounds as described in the British Patent Specification No. 789,823 filed Apr. 29, 1955 by Gevaert Photo-Producten N.V. and with small amounts of noble metal compounds such as gold, platinum, palladium, iridium, ruthenium, and rhodium.

Moreover, the emulsions may also contain compounds that sensitize the emulsion by development acceleration e.g. compounds of the polyoxyalkylene type, such as alkylene oxide condensation products as described i.a. in the U.S. Pat. No. 2,531,832 of William Alexander Stanton issued Nov. 28, 1950 and 2,533,990 of Ralph Kingsley Blake issued Dec. 12, 1950, in the British Patent Specifications 920,637 filed May 7, 1959, 940,051 filed November 1, 1961, 945.340 filed Oct. 23, 1961 by Gevaert Photo-Producten N.V. and 991,608 filed June 14, 1961 by Kodak Ltd. as well in the Belgian Patent Specification No. 648,710 filed June 2, 1964 by Gevaert Photo-Producten N.V., the known onium compounds including quaternary ammonium, quaternary phosphonium, and ternary sulphonium compounds or onium derivatives of the amine oxides as described in the British Patent Specification No. 1,121,696 filed Oct. 7, 1965 by Gevaert-Agfa N.V.

The emulsions may also comprise stabilizing agents e.g. heterocyclic nitrogen-containing thioxo compounds such as benzothiazolin-2-thione and 1-phenyl-2-tetrazolin-5-thione and compounds of the hydroxytriazolopyrimidine type. They can also be stabilized by means of mercury compounds such as those described in the Belgian Patent Specification Nos. 524,121 filed Nov. 7, 1953 by Kodak Ltd. and 677,337 filed Mar. 4, 1966 by Gevaert-Agfa N.V., in the British Patent Specification No. 1,173,609 filed Dec. 12, 1966 by the Applicant and the U.S. Pat. No. 3,179,520 filed Dec. 13, 1963 by Yoshio Miura, Akira Kumai and Yosuke Nakajima.

The emulsions may also comprise light-screening dyes, which have been selected in such a way that they absorb light of a wavelength range used to expose the material so that diffusion and reflection of the light in the photographic material are reduced. Details about such dyes can be found in Belgian Patent Specification No. 699,375 filed June 1, 1967 by Eastman Kodak Co. These dyes are used preferably in such amounts that per $\mu$m of emulsion layer thickness a density between 0.05 and 0.20 measured in the spectral range of the exposure, is obtained.

The emulsions according to the invention may also comprise hardening agents for hydrophilic colloids such as chromium, aluminium, and zirconium salts, formaldehyde, dialdehyde, hydroxyaldehyde, acrolein, glyoxal, halogen-substituted aldehyde acids such as mucochloric acid and mucobromic acid, diketones such as divinyl ketone, compounds carrying one or more vinylsulphonyl groups such as divinyl sulphone, 1,3,5-trivinylsulphonylbenzene, hexahydro-s-triazine containing vinylcarbonyl, halogenoacetyl and/or acyl groups such as 1,3,5-triacryloylhexahydro-1,3,5-triazine, 1,3-diacryloyl-5-acetylhexahydro-1,3,5-triazine, 1,3,5-trichloroacetylhexahydro-1,3,5-triazine, etc.

The light-sensitive emulsions may also contain any other type of additives such as plasticizers, coating aids, etc.

The emulsions can be applied to any of the common photographic supports. Typical supports are cellulose ester film, polyvinyl acetal film, polystyrene film, polyethylene terephthalate film and related films of polymeric materials as well as paper and glass. These supports may be provided with a subbing layer for the emulsion layer as well as with an antihalation layer.

The following examples illustrate the invention without, however, limiting the scope thereof.

EXAMPLE 1

A high-sensitive silver bromoiodide emulsion having an iodide content of 4.5 mole % of iodide was prepared in gelatin, flocculated, and added subsequently to gelatin. The pH-value was adjusted to 6.5 and the pAg-value to 8.3. After the addition of the known chemical sensitizing agents such as sulphur compounds and gold compounds the emulsion was ripened to the highest obtainable sensitivity.

The finished emulsion contained 130 g of silver nitrate per kg of silver halide. The silver nitrate/gelatin weight ratio was 1:0.75.

The usual wetting agents and stabilizing agents as well as hardening agents were added to the emulsion. The emulsion was divided into two parts.

Part A of the emulsion was coated on a polyethylene terephthalate support having a thickness of 150 $\mu$m and carrying a subbing layer. The silver halide coverage corresponded with 5.1 g of silver nitrate per sq.m.

The resulting layer was covered with the second part called emulsion B, which had been admixed additionally with the following optical sensitizing agents for the red and green spectral range:

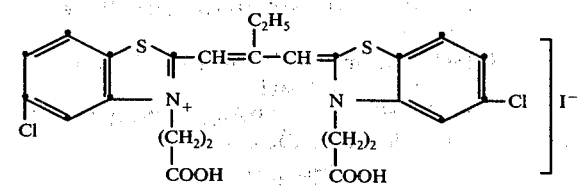

85 mg per mole of silver halide (sensitization maximum 645 nm - see Example 3 of the British Patent Specification No. 645,288 filed Feb. 24, 1948 by Eastman Kodak Co.) and

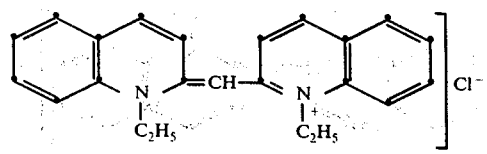

70 mg per mole of silver halide (sensitization maximum 530 nm - see Example 1 of the German Patent Specification No. 1,477,568 mentioned hereinbefore).

The silver halide coverage of the resulting layer corresponded with 7.0 g of silver nitrate per sq.m.

Furthermore, a gelatin layer containing hardening agents and, if needed, additives for improving the antistatic properties and the capability of being written on, was applied to this layer.

The back of the material was coated with an antihalation layer. The development was performed with a common p-monomethylaminophenol-hydroquinone developer as described e.g. in the German Patent Specification No. 1,447,568 mentioned hereinbefore. Depending on the development time at 28° C the following gamma values were obtained:

| development time | gamma values | | |
|---|---|---|---|
| | blue | green | red |
| 1 min 15 s | 0.95 | 0.97 | 0.96 |
| 1 min 35 s | 1.20 | 1.19 | 1.21 |
| 2 min 55 s | 1.62 | 1.58 | 1.60 |

The gamma values obtained for the blue, green, and red exposures were essentially identical so that the material could be used for the automatic production of colour separation images serving for the manufacture of the yellow, megenta, and cyan printing plate.

The curves of the filters used in the blue, the green, and the red exposure are indicated by U449, U531, and L622 respectively and represented in FIG. 1. For the production of the spectrogram and exposure was performed with a light source having a colour temperature of 3200° K.

Figure 4:
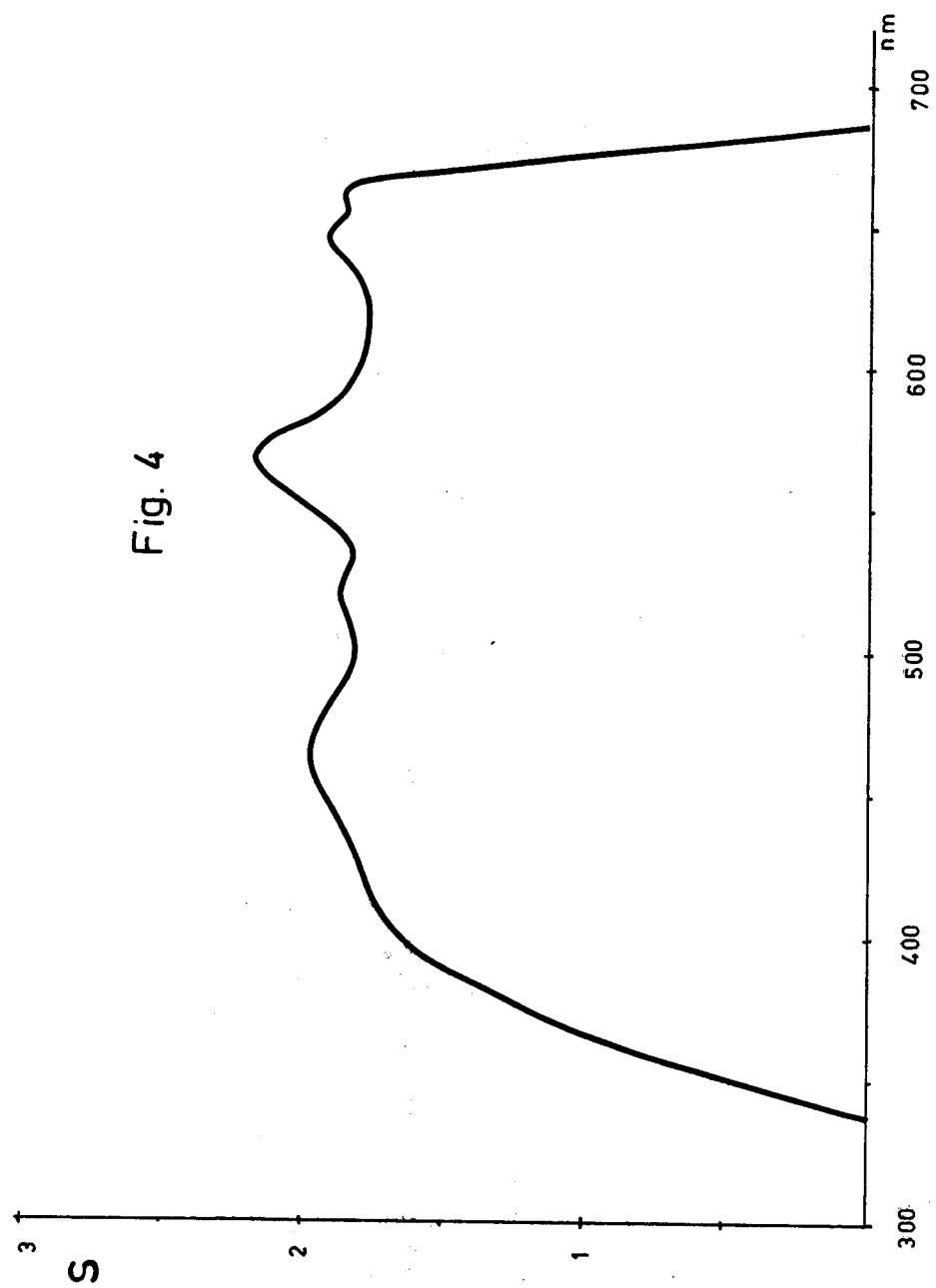

The spectral sensitivity of the material prepared as described above is expressed in FIG. 4 in the form of a spectrogram (sensitivity (S) expressed logarithmically, measured at density 1.0 versus wavelength (nm)).

When the exposure of this material was performed through a colour diapositive containing a magenta dye having a side-absorption in the red (beyond 600 nm) and when the red filter L622 (see FIG. 2) was used as filter, the film exposed and developed as described above showed that the contrast in the red image areas of the original was reproduced unsatisfactorily.

EXAMPLE 2

Example 1 was repeated with the sole difference that the spectral sensitization of emulsion portion B was performed with 95 mg per mole of silver halide of the sensitizing agent corresponding to the following structural formula:

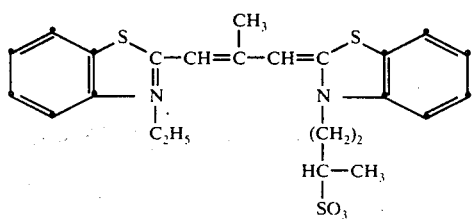

(sensitization maximum at 630 nm; broad maximum at 525 nm).

After the coating and drying of the emulsion layer B on the non spectrally-sensitized emulsion layer A the material was exposed and developed as described in Example 1.

The evaluation of the red reproduction proved that all details in the negative were reproduced with sufficient contrast and were clearly discernible.

EXAMPLE 3

A high-sensitive silver bromoiodide emulsion having an iodide content of 4.5 mole % of iodide was prepared in gelatin, flocculated, and added to gelatin. After the adjustment of the pH-value to 6.5 and of the pAg-value to 8.3 the known chemical sensitizing agents such as sulphur compounds and gold compounds were added and the emulsion was ripened to the maximum obtainable sensitivity.

The finished emulsion contained an amount of silver halide corresponding to 130 g of silver nitrate. The silver nitrate/gelatin weight ratio was 1:0.75.

The usual wetting agents, stabilizing agents, and hardening agents were added to the emulsion. The emulsion was divided into two portions A and B. 79 mg of the sensitizing agent R, corresponding to the following structural formula:

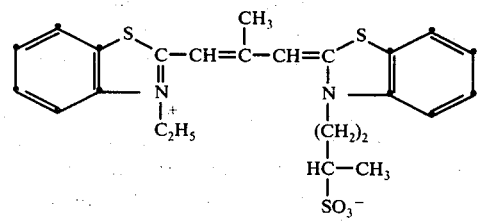

were added to portion A of the emulsion per mole of silver halide. At the same time 66 mg of the sensitizing agent G corresponding to the following structural formula were added:

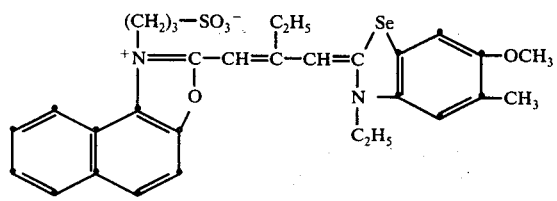

(first sensitization maximum: 550 nm; second sensitization maximum: 620 nm).

13 mg of the above-mentioned sensitizing agent G were added per mole of silver halide to portion B of the emulsion.

Portion B of the emulsion was then coated on a polyethylene terephthalate support having a thickness of 150 μm and carrying a subbing layer. The silver halide coverage corresponded to 5.1 g of silver nitrate per sq.m.

Emulsion portion A was coated on the resulting layer. The silver halide coverage of this layer corresponded to 7.0 g of silver nitrate per sq.m.

Furthermore, a gelatin layer containing hardening agents and additives for improving the antistatic properties and the capability of being written on, was applied to this layer.

Figure 5:
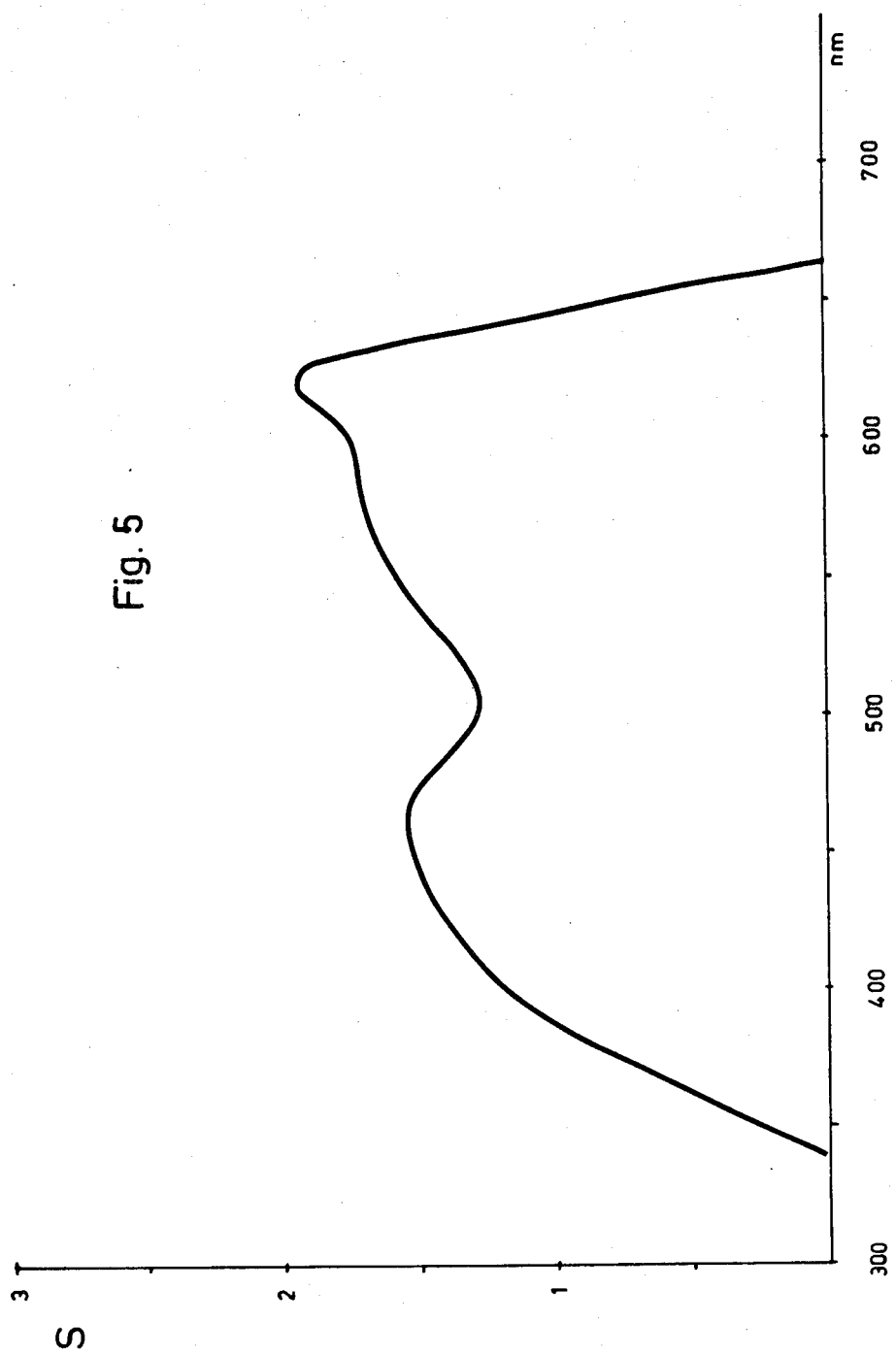

The back of the material was coated with an antihalation layer. The spectral sensitivity of thus obtained material is represented in the form of a spectrogram in FIG. 5 (sensitivity (S) expressed logarithmically, measured at a density 1.0 versus wavelength (nm)). In the production of the spectrogram the exposure was performed with a light source having a colour temperature of 3200° K.

For the production of the red filter negative the exposure of the material was performed through the colour diapositive used in Example 1 and red filter L622.

When evaluated as to the red reproduction, the film developed as described in Example 1 showed that the contrast in the red image areas of the original was clearly reproduced on the negative.

We claim:

1. In a photographic panchromatic black-and-white silver halide recording material having two silver halide emulsion layers wherein a first layer has a panchromatic sensitivity, and a second layer has a blue sensitivity which as determined by the Relative Sensitivity Test as defined in the specification is at least 0.6 log I.t units higher than each of its green and red sensitivities, and both said first and second layers have substantially the same threshold sensitivity to blue light; the improvement whereby at least said first layer is spectrally sensitized so that the spectral sensitivity of the photographic material measured at density 1.0, is at least 0.8 powers of ten lower at 650 nm than at 620 nm, and decreases further beyond 650 nm.

2. Photographic material according to claim 1, wherein the spectral sensitivity of said material at 650 nm is 1.10 to 1.30 powers of ten lower than at 620 nm.

3. Photographic material according to claim 1, wherein the first layer contains as spectral sensitizing agent(s) only one sensitizing dye or sensitizing dyes corresponding to the following general formula:

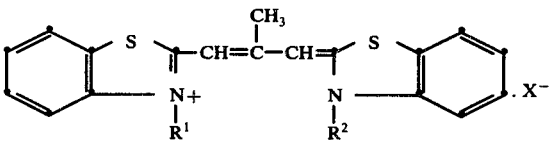

in which:

$R^1$, $R^2$ (same or different) represent lower alkyl, sulphoalkyl, carboxyalkyl, $X^-$ represents an anion, which does not exist, when $R^1$ or $R^2$ represents sulphoalkyl.

4. Photographic material according to claim 1, wherein the first layer contains as sole spectral sensitizing dye a dye corresponding to the following structural formula:

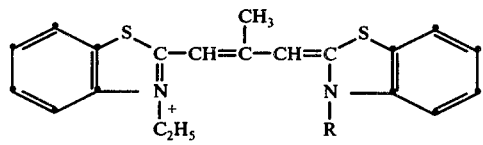

in which R represents

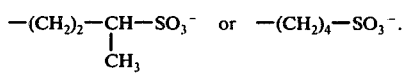

5. Photographic material according to claim 1, wherein the first layer contains a mixture of spectral sensitizing dyes comprising a sensitizing dye corresponding to formula I:

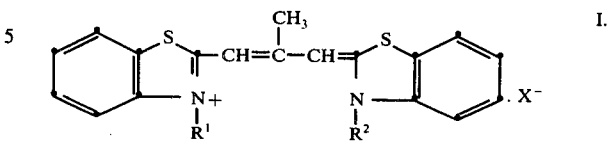

in which
$R^1$ and $R^2$ (same or different) represent lower alkyl, sulphoalkyl, or carboxyalkyl,
$X^-$ represents an anion, which does not exist, when $R^1$ and $R^2$ represent sulphoalkyl, and a sensitizing dye corresponding to formula II:

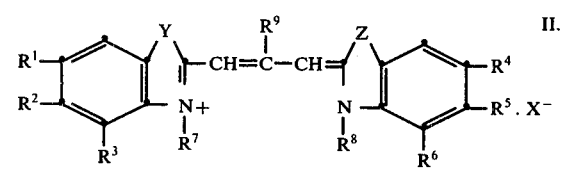

in which:
Y represents O, NR (R being lower alkyl),
Z represents S or Se,
$R^1$, $R^2$, and $R^3$ representing hydrogen, methyl, aryl, halogen, alkylmercapto or $R^1$ and $R^2$, or $R^2$ and $R^3$, together represent the elements needed to complete an aromatic nucleus,
$R^4$, $R^5$, and $R^6$ represent hydrogen, methyl, methoxy, halogen, or $R^5$ and $R^6$ together represent the elements needed to complete an aromatic nucleus,
$R^7$ and $R^8$ (same or different) represent lower alkyl, sulphoalkyl, lower carboxyalkyl, acylaminosulphonylalkyl, or N-alkylsulphonylcarbonamidoalkyl,
$R^9$ represents hydrogen, lower alkyl, and
$X^-$ represents an anion, which does not exist, when $R^7$ or $R^8$ has an anionic structure.

6. Photographic material according to claim 1, wherein the first silver halide emulsion layer contains a mixture of the spectral sensitizing dyes corresponding to the following structural formulae:

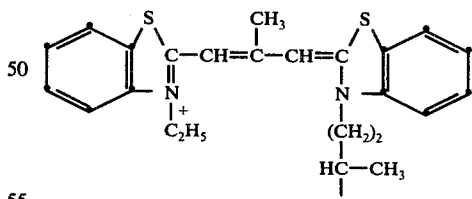

and

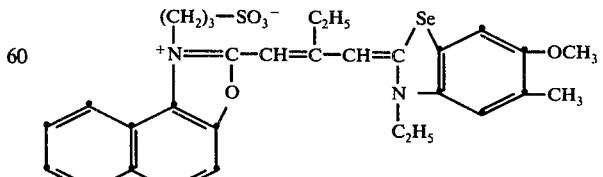

7. Photographic material according to claim 1, wherein the second layer contains a spectral sensitizing dye corresponding to the following structural formula:

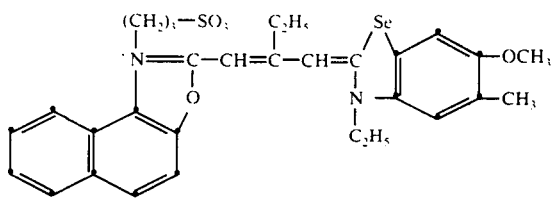

8. Photographic material according to claim 1 wherein the first layer contains a mixture of spectral sensitizing dyes comprising a sensitizing dye corresponding to formula II:

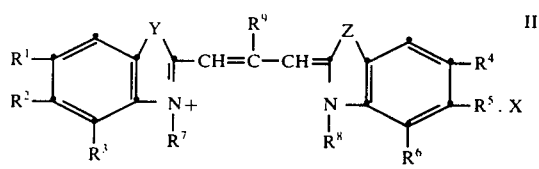

in which:
Y represents O, NR (R being lower alkyl),
Z represent S, Se,
$R^1$, $R^2$, and $R^3$ represent, hydrogen, methyl, aryl, halogen, alkyl-mercapto or $R^1$ and $R^2$, or $R^2$ and $R^3$ together represent the atoms needed to complete an aromatic nucleus,
$R^4$, $R^5$, and $R^6$ represent hydrogen, methyl, methoxy, halogen or $R^5$ and $R^6$ together represent the atoms needed to complete an aromatic nucleus,
$R^7$ and $R^8$ (similar or different) represent lower alkyl, sulphoalkyl, lower carboxyalkyl, acylaminosulphonylalkyl or N-alkylsulphonyl carbonamidoalkyl,
$R^9$ represents hydrogen, lower alkyl, and $X^{31}$ represents an anion, which does not exist when $R^7$ or $R^8$ has an anionic structure,
and a sensitizing dye corresponding to formula III:

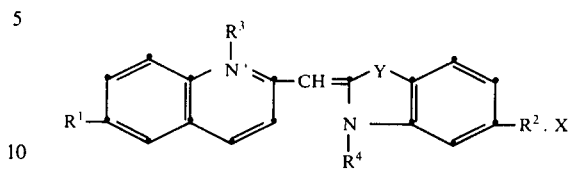

in which:
$R^1$ and $R^2$ (equal or different) represent hydrogen, methyl, methoxy, halogen,
Y represents Se, CH=CH,
$R^3$ and $R^4$ (same or different) represent methyl, ethyl, sulphopropyl, sulphobutyl, sulphoisobutyl.
X—represents an anion, which does not exist when $R^3$ or $R^4$ is sulphoalkyl.

9. Photographic material according to claim 1, wherein the blue threshold sensitivity of the first and second layer, measured at a density of 0.3, corresponds with a difference in sensitivity of at most 0.2 log It.

10. Photographic material according to claim 1, wherein the silver halide of the first and the second layer has the same composition.

11. Photographic material according to claim 1, wherein the first and the second emulsion layer are coated from a silver bromoiodide emulsion.

12. Method for the production of colour separation images for the cyan printing, wherein the material of claim 1 is exposed through a red filter and to an original containing a magenta dye with a side-absorption in the red spectral range beyond 600 nm.

13. Method according to claim 12, wherein said material is exposed through said original and through a red filter having a transmission of less than 50% at 595 nm.

14. Method according to claim 13, wherein the red filter has a density as represented in FIG. 2 of the drawing in the specification.

* * * * *

UNITED STATES PATENT OFFICE
CERTIFICATE OF CORRECTION

Patent No. 4,118,228          Dated October 3, 1978

Inventor(s) Hans Josephus Corluy et al

It is certified that error appears in the above-identified patent and that said Letters Patent are hereby corrected as shown below:

Claim 8, formula II (the first structural formula), the negative electrical charge sign ( $-$ ) is omitted from the symbol X;

Claim 8, line 1 of column 18, "$X^{31}$" should read -- $X^-$ --;

Claim 8, formula III (the second structural formula), the positive electrical charge sign ( $+$ ) is omitted from the left hand ring nitrogen atom, and the negative electrical charge sign ( $-$ ) is omitted from the symbol X;

Claim 8, second to last line, "X—" should read -- $X^-$ --.

Signed and Sealed this

Sixteenth Day of January 1979

[SEAL]

Attest:

RUTH C. MASON
*Attesting Officer*

DONALD W. BANNER
*Commissioner of Patents and Trademarks*